(12) United States Patent
Besling et al.

(10) Patent No.: US 9,340,412 B2
(45) Date of Patent: May 17, 2016

(54) SUSPENDED MEMBRANE FOR CAPACITIVE PRESSURE SENSOR

(71) Applicant: ams International AG, Rapperswil-Jona (CH)

(72) Inventors: Willem Besling, Eindhoven (NL); Remco Henricus Wilhelmus Pijnenburg, Hoogeloon (NL); Casper van der Avoort, Waalre (NL); Marten Oldsen, Kleve (DE); Martijn Goossens, Veldhoven (NL)

(73) Assignee: ams International AG, Rapperswil-Jona (CH)

( * ) Notice: Subject to any disclaimer, the term of this patent is extended or adjusted under 35 U.S.C. 154(b) by 0 days.

(21) Appl. No.: 14/444,921

(22) Filed: Jul. 28, 2014

(65) Prior Publication Data

US 2016/0023893 A1    Jan. 28, 2016

(51) Int. Cl.
| | |
|---|---|
| *G01L 9/12* | (2006.01) |
| *B81C 1/00* | (2006.01) |
| *G01L 9/00* | (2006.01) |
| *H01L 29/84* | (2006.01) |

(52) U.S. Cl.
CPC ......... *B81C 1/00158* (2013.01); *B81C 1/00246* (2013.01); *G01L 9/0072* (2013.01); *G01L 9/12* (2013.01); *H01L 29/84* (2013.01)

(58) Field of Classification Search
CPC .................................. H01L 29/84; G01L 9/12
USPC ............................................ 257/415; 73/718
See application file for complete search history.

(56) References Cited

U.S. PATENT DOCUMENTS

| | | |
|---|---|---|
| 6,274,440 B1 | 8/2001 | Arndt et al. |
| 6,887,391 B1 | 5/2005 | Daneman et al. |
| 2008/0128841 A1* | 6/2008 | Fujimori et al. ............... 257/418 |
| 2009/0124035 A1 | 5/2009 | Rey et al. |
| 2011/0127878 A1* | 6/2011 | Yamazaki ..................... 310/300 |

(Continued)

FOREIGN PATENT DOCUMENTS

| | | |
|---|---|---|
| EP | 2674392 A1 | 12/2013 |
| EP | 2711677 | 3/2014 |

OTHER PUBLICATIONS

Machida "MEMS Technology Using Back-end of Line Processes in CMOS LSI" IEEE, 2010 International Interconnect Technology Conference, (Jun. 2010), 3 pages.

*Primary Examiner* — David Vu
*Assistant Examiner* — Brandon Fox
(74) *Attorney, Agent, or Firm* — McDermott Will & Emery LLP

(57) ABSTRACT

Embodiments of a method for forming a suspended membrane include depositing a first electrically conductive material above a sacrificial layer and within a boundary trench. The first electrically conductive material forms a corner transition portion above the boundary trench. The method further includes removing a portion of the first electrically conductive material that removes at least a portion of uneven topography of the first electrically conductive material. The method further includes depositing a second electrically conductive material. The second electrically conductive material extends beyond the boundary trench. The method further includes removing the sacrificial layer through etch openings and forming a cavity below the second electrically conductive material. The first electrically conductive material defines a portion of a sidewall boundary of the cavity.

20 Claims, 6 Drawing Sheets

(56) References Cited

U.S. PATENT DOCUMENTS

| | | |
|---|---|---|
| 2012/0167659 A1 | 7/2012 | Besling et al. |
| 2013/0036827 A1 | 2/2013 | Besling |
| 2013/0118265 A1 | 5/2013 | Besling et al. |
| 2013/0122332 A1 | 5/2013 | van Lammeren et al. |
| 2013/0233086 A1 | 9/2013 | Besling et al. |
| 2013/0316830 A1 | 11/2013 | Sedzin et al. |
| 2013/0319125 A1* | 12/2013 | Wang et al. ............... G01L 9/12 73/724 |
| 2013/0328142 A1 | 12/2013 | Nackaerts et al. |
| 2014/0053621 A1 | 2/2014 | Zuraski et al. |
| 2014/0053651 A1* | 2/2014 | Besling et al. ......... G01L 9/0016 73/702 |
| 2014/0070337 A1 | 3/2014 | Besling et al. |

* cited by examiner

SUSPENDED MEMBRANE FOR CAPACITIVE PRESSURE SENSOR

MEMS sensors are used in automotive, consumer, industrial, medical, and many other applications. In addition, pressure sensors have many applications. Many applications utilize piezo resistive pressure sensors to measure pressure. Piezo resistive sensors utilizing a silicon membrane are circumferentially anchored to a silicon substrate and utilize more area of the substrate. Pressure is measured via deflection of the membrane due to an external pressure. Large deflections or temperature differences induce significant non-linearity in piezo resistive read-out elements, which may present challenges in a variety of applications.

Accurate and repeatable manufacturing processes of membranes and pressure sensors allow for more accurate pressure readings over a range of temperatures and pressures and allows for use in a larger variety of applications. In addition, semiconductor devices benefit from reducing the footprint has various applications. As the size of electronic devices continues to decrease, reducing the footprint of semiconductor devices may be beneficial.

Embodiments of a method for forming a suspended membrane are disclosed. One embodiment of a method includes depositing a first electrically conductive material above a sacrificial layer and within a boundary trench. The first electrically conductive material forms a corner transition portion above the boundary trench. The method further includes removing a portion of the first electrically conductive material that removes at least a portion of uneven topography of the first electrically conductive material. The method further includes depositing a second electrically conductive material. The second electrically conductive material extends beyond the boundary trench. The method further includes removing the sacrificial layer through etch openings and forming a cavity below the second electrically conductive material. The first electrically conductive material defines a portion of a sidewall boundary of the cavity. Some embodiments include conformally depositing the first and/or second electrically conductive material.

In some embodiments, the suspended membrane is formed as part of a capacitive pressure sensor. In some embodiments, the capacitive pressure sensor is formed on top of an integrated circuit. In some embodiments, the capacitive pressure sensor is formed on top of an integrated read-out circuit. Piezo resistive pressure sensors are not integrated on top of integrated circuits. Piezo resistive materials such as poly crystalline and mono crystalline silicon cannot be deposited a low temperatures (i.e., below 400° C.) and therefore, cannot be deposited on top of CMOS devices. Utilizing a suspended membrane made of tungsten allows for the fabrication of capacitive pressure sensors on top of integrated circuits utilizing standard CMOS fabrication techniques and tools. Because the capacitive pressure sensors are formed on top of an integrated circuit, the overall footprint of a device may be reduced as a dual die package solution is not utilized. A single die approach may be implemented, which is less costly than a dual die package and may reduce use of expensive silicon area. In addition, tungsten is inert to HF vapor, which may be used to remove the sacrificial layer and suspend the membrane. The HF vapor will not attack the tungsten membrane during etching of the sacrificial layer. Tungsten also has a low coefficient of thermal expansion, allowing the suspended membrane to not be overly sensitive to temperature variations of differing applications. However, tungsten has a relative high stress that may lead to failure of the membranes during etching of the sacrificial layer and release of the membrane.

Some embodiments include forming a bottom electrode below the suspended membrane, the electrode including an electrically conductive metal. The suspended membrane forms part of a second electrode. In some embodiments, the method further includes forming an isolation layer or etch stop above the bottom electrode. In some embodiments, the isolation layer/etch stop may include a silicon rich-silicon nitride. In some embodiments, the method includes removing the corner transition portion of the first electrically conductive material above the boundary trench. After removal of a portion of the first electrically conductive material, an adhesive layer may be deposited before the deposition of the second electrically conductive material. In some embodiments, the adhesive layer improves adhesion to the underlying layer, avoiding etching of the underlying oxide during CVD tungsten deposition, reduces stress on the second electrically conductive material, and creates a good Ohmic electrical contact to the underlying first electrically conductive material. The adhesive layer may be applied by physical vapor deposition. In some embodiments, the adhesive layer includes titanium, titanium nitride, or a combination thereof. In some embodiments, an adhesive layer is formed on top of the second electrically conductive material and may serve similar functions as an adhesive layer below the second electrically conductive material. Some embodiments include a first adhesive layer below the second electrically conductive material as well as a second adhesive layer on top of the second electrically conductive material. Some embodiments include only one adhesive layer.

In addition to improving adhesion, the adhesive layers also may reduce the total stress on the suspended membrane. Removal of a sacrificial layer to suspend the membrane may lead to high stress and stress failure in localized high stress areas. The adhesive layers can reduce and offset the stress in the membrane when released.

Embodiments of a method for forming a capacitive pressure sensor on top of an integrated circuit are disclosed. One embodiment of a method includes forming a bottom electrode, forming a sacrificial layer above the bottom electrode. A boundary trench defines a portion of a side boundary of the sacrificial layer. The method further includes conformally depositing a first layer of a material above the sacrificial layer and within the boundary trench. The first layer of the material forms a corner transition portion above the boundary trench. The method further includes removing a portion of the first layer of the material and depositing a second layer of the material. The removing removes at least a portion of uneven topography of the first layer of the material and the second layer extends beyond the boundary trench. The method further includes removing the sacrificial layer through etch openings, forming a cavity between the bottom electrode and the second layer of the material, and sealing the etch openings. The first layer of the material deposited within the boundary trench defines a portion of a sidewall boundary of the cavity.

In some embodiments, the capacitive pressure sensor is formed on top of an integrated circuit. In some embodiments, the capacitive pressure sensor is formed on top of an integrated read-out circuit. Because the capacitive pressure sensor is formed on top of an integrated circuit, the footprint of the device is significantly reduced compared to dual die solutions or a solution where the pressure sensor is integrated next to CMOS.

Embodiments of a semiconductor device are disclosed. One embodiment of a semiconductor device includes a top electrode suspended above a bottom electrode with a cavity separating the bottom and top electrode. The top electrode includes a first electrically conductive material. The first electrically conductive material forms a portion of a sidewall boundary of the cavity. The top electrode further includes a second electrically conductive material above the cavity. The second electrically conductive material extends beyond the first electrically conductive material. A portion of the first electrically conductive material serves as supporting anchors for the second electrically conductive material. The second electrically conductive material includes a substantially flat topography over the cavity and the supporting anchors. The first electrically conductive material serves as support for suspending the second electrically conductive material above the cavity. Other embodiments of a semiconductor device are also disclosed.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

Figure 1:
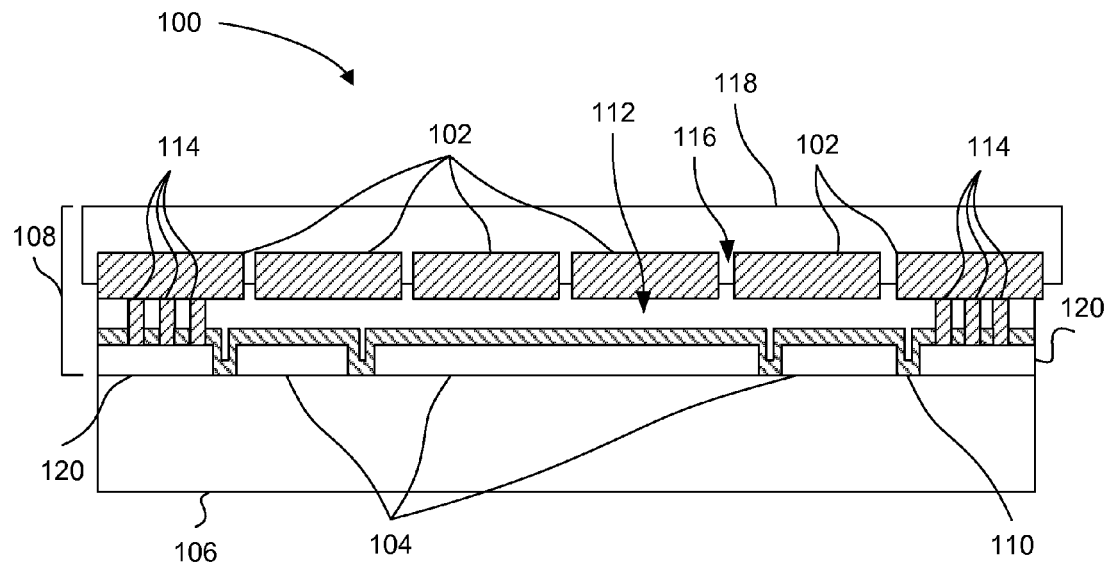
FIG. 1 depicts a cut-away view of an embodiment of a suspended membrane of a semiconductor device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The emergence of silicon as a sensing material has influenced pressure measurement in industrial and commercial applications. Silicon-based sensors use a technology that has since become known as MEMS, or micro electro mechanical systems.

MEMS sensors have been employed in automotive, consumer, industrial, and medical applications within benign environments. Compact in size, they can be relatively inexpensive in high-production volumes. Most MEMS pressure sensors have a piezo resistive read-out that is able to determine the state of deflection of a suspended membrane. Also optical, capacitive, and resonance frequency based read-out circuits are known in the art.

Typically, a piezo resistive pressure sensor has a suspended crystalline Si membrane construction which is circumferentially anchored to a Si substrate. On top of this membrane, piezo resistive elements are deposited and patterned into strain gauges within a Wheatstone bridge configuration. The deflection of the Si membrane can be determined with an external readout circuit that is able to measure a small resistance change in the bridge. The sacrificial material underneath the Si membrane is removed by wet or dry etching techniques creating a free suspended membrane overlying a cavity.

Pressure is measured via deflection of the membrane due to a pressure difference between an external pressure and a gauge pressure which can be the ambient environmental pressure. The gauge pressure can also be a constant reference pressure. If the reference pressure is a vacuum an absolute pressure reading can be determined Such type of sensor is called an absolute pressure sensor.

The internal reference pressure inside a hermetically closed cavity should be ideally a vacuum or at least close to vacuum to minimize expansion of the gas due to temperature variations. The membrane should be hermetically closed to avoid pressure build-up inside the cavity and to avoid signal drift over time.

The piezo resistive properties of Si are used to determine strain in the membrane that is imposed by the pressure difference. However, a large deflection and or temperature differences induce significant non-linearity in the piezo resistive read-out elements. These and other matters have presented challenges to the implementation of pressure sensors, for a variety of applications.

Pressure sensors using the piezo resistive read-out principle are not integrated on top of ICs because the standard piezo resistive material (crystalline Si) cannot be deposited at low temperatures (i.e. below 400° C.) on top of CMOS. This has implications for the form factor of the device because a dual die package solution is required which is also more costly than a single die approach. Moreover, the intrinsic difficulty in measuring a correct temperature of the pressure sensor die to correct for temperature variations leads to larger inaccuracy in the pressure measurements.

In contrast, a capacitive read-out allows constructing and integrating the pressure sensitive membrane on top of an integrated circuit. This enables not only a reduction in form factor with a single die solution but also gives a reduction of expensive Si area compared to a "next to IC" option. In addition, the capacitive read-out gives significant improvements with respect to the sensitivity and the power consumption of the read-out ASIC.

One process to manufacture a capacitive pressure sensor on top of CMOS includes forming electrode layers on top of a passivation layer, forming a cavity between the electrodes, and sealing the cavity by chemical vapor deposition (CVD) and/or Plasma Enhanced Chemical Vapor Deposition (PECVD). Such a process may utilize tungsten (W) or tungsten silicide (WSi) as electrode materials as tungsten or tungsten silicide are not etched by vapor HF in the cavity formation step. Tungsten provides advantages for processing and for material properties. In addition to being inert to vapor HF, tungsten has a low coefficient of thermal expansion allowing tungsten to be beneficial to in constructing free hanging membranes. Tungsten also increases the buckling temperature which is important during deposition of the sealing layer. Additionally, utilizing tungsten reduces the temperature sensitivity of the final pressure sensitive membrane. However, tungsten membranes may have areas of relative high stress that lead to failures and fractures of the membrane.

Another disadvantage of the above approach is that the definition of the cavity and membrane diameter is difficult to control. As the sacrificial layer is laterally etched from etch openings, the size of the cavity is difficult to control as it depends on controlling the lateral etching rate of the underlying sacrificial oxide. Poor control about the lateral etching rate has a dramatic impact on sensor performance as is demonstrated by the following example. A (static) pressure causes a deflection of the membrane and thus a change in the capacitance. As an example the deflection behavior is given of a circular membrane w(r,P) in the flexural rigidity dominated regime as function of pressure P $$w(r, P) = \frac{3PR^4(1-v^2)}{16Eh^3}\left[1-\left(\frac{r}{R}\right)^2\right]^2$$

where R is the radius of the membrane and r the distance from the edge to the actual deflection point, v the Poisson ratio, E the Young's modulus and h the membrane thickness. As is apparent from the relation above, (the deflection scales with $R^4$ and $1/h^3$) small variations in membrane size and membrane thickness have large impact on the deflection profile and hence the capacitance. For this particular reason there will be also significant spread in the pressure sensitivity when geometrical properties such as thickness and diameter are not kept within well controlled limits. The oxide etch rate further depends on pressure, temperature, and the water concentration. In addition, during HF vapor exposure water is generated which could accelerate the etching process and lead to non-uniform etching profiles and non-uniform membrane diameters. Controlling the lateral etching of the sacrificial layer allows for easier control of the diameter of a membrane.

While many embodiments are described herein, at least some of the described embodiments for the fabrication of capacitive pressure sensors on top of integrated circuits utilizing standard CMOS fabrication techniques and tools. Some embodiments provide increased signal to noise ratio with integrated EMI shielding on the chip. Some embodiments reduce parasitic capacitances by not using bond wires. Integration of capacitive pressure sensors on CMOS allow for temperature measurement on the same die which allows for accurate temperature compensation. Some embodiments reduce cost as the silicon substrate area utilized is smaller. Some embodiments allow for the combination of a read-out circuit with other sensor modalities and functions. Some embodiments reduce operating power and costs and increased pressure sensitivity.

Some embodiments allow for good definition of the cavity size using tungsten filled anchors within boundary trenches and therefore a well controlled deflection behavior of the membrane. Some embodiments avoid stress build-up at membrane anchors by removal of topography around anchors and above the boundary trenches. Some embodiments allow stress tuning of the membrane stack with thick adhesive layers. Some embodiments mitigate cracking of the membranes as adhesive layers can be decoupled from the filling of the boundary trenches. Some embodiments provide low thermal expansion of the membrane due to the use of tungsten as the main construction material for the membrane. Some embodiments allow for high PECVD sealing temperatures resulting in dense sealing layer with excellent hermeticity and low outgassing properties. Some embodiments allow for deposition of compressive PECVD SiN sealing layers with excellent hermeticity and low outgassing. Some embodiments allow for suppressing membrane buckling during the sealing process due to the high deposition temperature of CVD tungsten and the low CTE mismatch of tungsten and the underlying substrate.

FIG. 1 depicts a cut-away view of an embodiment of a suspended membrane 102 of a semiconductor device 100. Although the semiconductor device 100 is shown and described with certain components and functionality, other embodiments of the semiconductor device 100 may include fewer or more components to implement less or more functionality.

The depicted semiconductor device 100 includes various components that perform the functions described in more detail above and below. The illustrated semiconductor device 100 includes a bottom electrode 104. The bottom electrode 104 is formed above an integrated circuit 106 (details of which are not shown). In some embodiments, the bottom electrode 104 is formed on top of the final passivation layer of a CMOS read-out circuit. The bottom electrode 104 may be segmented and may consist of multiple annular rings. Although not shown, the electrodes and membranes of the capacitive pressure sensor 108 may be electrically connected to the integrated circuit 106. The illustrated semiconductor device 100 further includes an isolation layer 110 (also an etch stop layer) covering the bottom electrode 104 and protecting the bottom electrode 104 during etching of a sacrificial oxide layer. Etching the sacrificial layer creates a cavity 112 above the bottom electrode 104. The cavity 112 sidewalls are formed by a first electrically conductive material 114 that may deposited in a boundary trench forming a portion of the boundary of the sacrificial layer. The first electrically conductive material 114 forms at least a portion of the sidewalls of the cavity 112. A second electrically conductive material forms the suspended membrane 102 and covers the cavity 112 and extends beyond the boundary trench and the first electrically conductive material 114. The first electrically conductive material 114 serves as supporting anchors for the second electrically conductive material or suspended membrane 102. The suspended membrane 102 includes etch openings 116 through which the sacrificial layer can be etched and removed, thereby creating the cavity 112. After removing the sacrificial layer, a sealing layer 118 may seal the cavity 112 by sealing the etch openings 116. The illustrated semiconductor device 100 also depicts connections 120 to connect the top electrode or membrane 102 to the integrated circuit 106 or elsewhere.

Although not shown, the semiconductor device 100 may include aluminum contact pads which may provide the required connections to a device. Various vias may extend down from the contact pads to the bottom electrode, and also from the bottom electrode to the CMOS top metal layer if desired.

Figure 2:
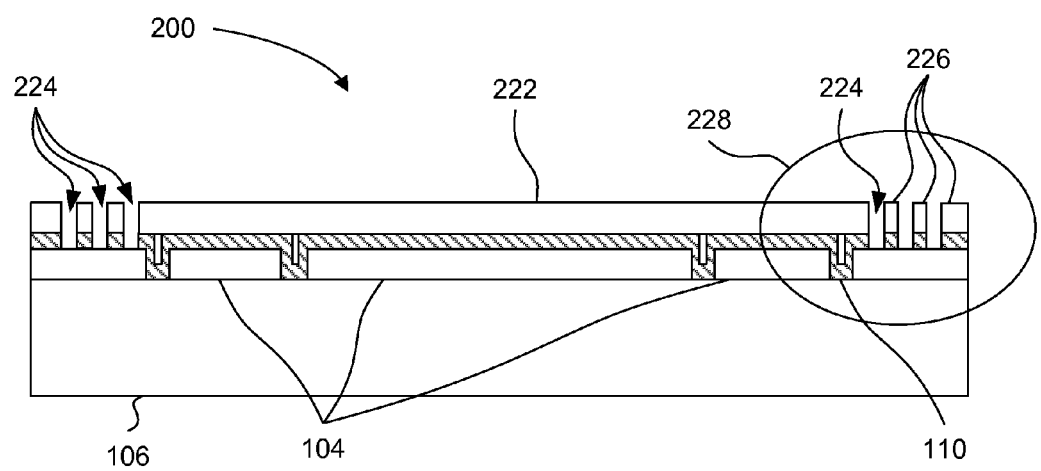
FIG. 2 depicts a cut-away view of an embodiment of a semiconductor device after depositing a sacrificial layer.

FIG. 2 depicts a cut-away view of an embodiment of a semiconductor device 200 after depositing a sacrificial layer 222. The process and steps outlined in FIG. 2 and FIGS. 3A through 3I depict various embodiments of forming a semiconductor device similar to the semiconductor device 100 of FIG. 1. Although the semiconductor device 200 and the semiconductor device 300 of FIGS. 3A through 3I is shown and described with certain components and functionality and certain steps, other embodiments may include fewer or more components or steps to implement less or more functionality. The figures as presented are not meant to convey any perceived thickness and/or dimensions of various components.

The illustrated semiconductor device 200 depicts a bottom electrode 204 and an isolation layer/etch stop 210 already formed above an integrated circuit 206. In addition, a sacrificial layer 222 is formed above the bottom electrode 204. The illustrated semiconductor device 100 also includes additional oxide 226 separated from the sacrificial layer 222 by boundary trenches 224. The illustrated embodiment includes three boundary trenches 224 on each side of the sacrificial layer 222. In some embodiments, there may be a single boundary trench 224 or any number of boundary trenches 224. In some embodiments, the boundary trenches 224 may extend completely around a perimeter of the sacrificial layer 222. In some embodiments, the boundary trenches 224 are not continuous around a perimeter of the sacrificial layer 222 and may be only at certain points or lengths around the perimeter of the sacrificial layer 222. It should be noted as well that the boundary trenches 224 allow for designing the appropriate shape of the cavity and membrane to better serve the needs of a particular application. The boundary trench serves to define exactly the suspension length and width of the membrane. If the boundary trenches are not continuous around the perimeter of the sacrificial layer a suspended wire can be constructed with a well defined suspension length and allowing to make separated contact terminals. A part of the semiconductor device 200 is emphasized by circle 228. FIGS. 3A through 3I focus on this portion of a semiconductor device 300.

The isolation layer/etch stop 210 may be provided to prevent shorts between a top electrode and the bottom electrode 204 as well as to avoid etching of an underlying passivation layer. The isolation layer/etch stop 210 may be a SiN (including a silicon rich SiN), SiC, and/or $Al_2O_3$, or a combination thereof, or another suitable material to prevent shorts and avoid etching. Embodiments may vary and utilize separate components to effectuate the functions of the isolation layer/etch stop 210. In some embodiments, an etch stop layer is formed below the bottom electrode 204. To prevent shorts between the bottom electrode 204 and a top electrode, an isolation layer or anti-shorting layer is formed on top of the bottom electrode 204. In some embodiments, there is an isolation layer on top of the sacrificial layer 222. In some embodiments, there is an isolation layer below and above the sacrificial layer 222. One of the layers could be patterned to devise anti-stiction bumps. In addition, the presence of a layer above the sacrificial layer may become a support layer for the top electrode or membrane to avoid buckling.

Figure 3A:
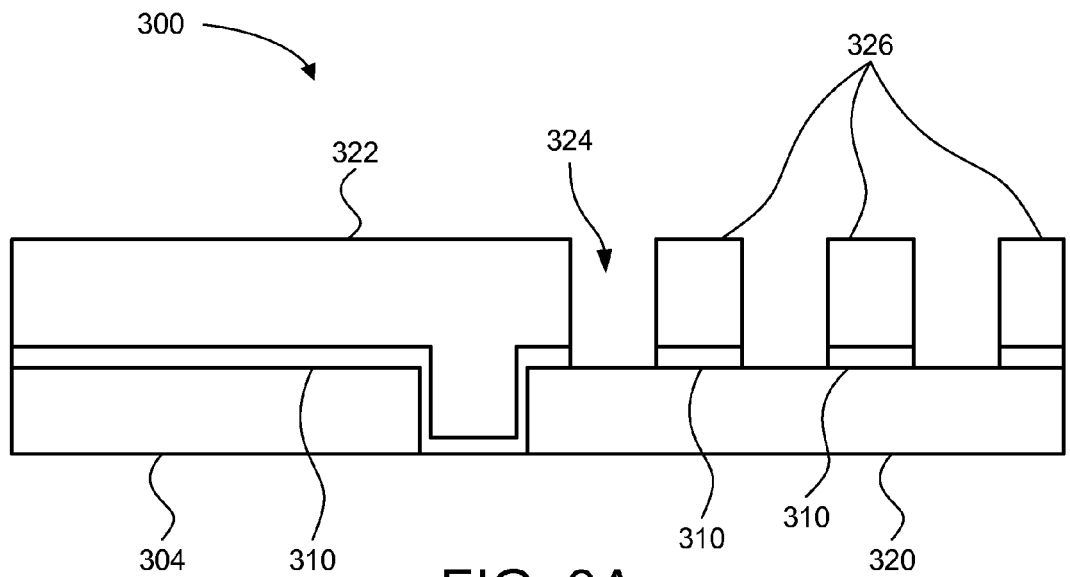
FIG. 3A depicts a cut-away view of a part of an embodiment of a semiconductor device similar the semiconductor device of FIG. 2.

FIG. 3A depicts a cut-away view of a part of an embodiment of a semiconductor device 300 similar the semiconductor device 200 of FIG. 2. The illustrated embodiment depicts a bottom electrode 304, an isolation layer (and/or etch stop layer) 310, connectors 320, a sacrificial layer 322, and additional material 326 to help form the boundary trenches 324. Boundary trenches 324 form at least a portion of the sidewall boundary of the sacrificial layer 322. In some embodiments, the boundary trenches 324 form the entire sidewall boundary of the sacrificial layer 322. The isolation layer 310 isolates the bottom electrode 304 from the top electrode or suspended membrane in situations where the suspended membrane collapses or otherwise comes in contact with the bottom electrode 304. Additionally, the isolation layer 310 may serve as an etch stop to protect the bottom electrode 304 during etching of the sacrificial layer 322.

Figure 3B:
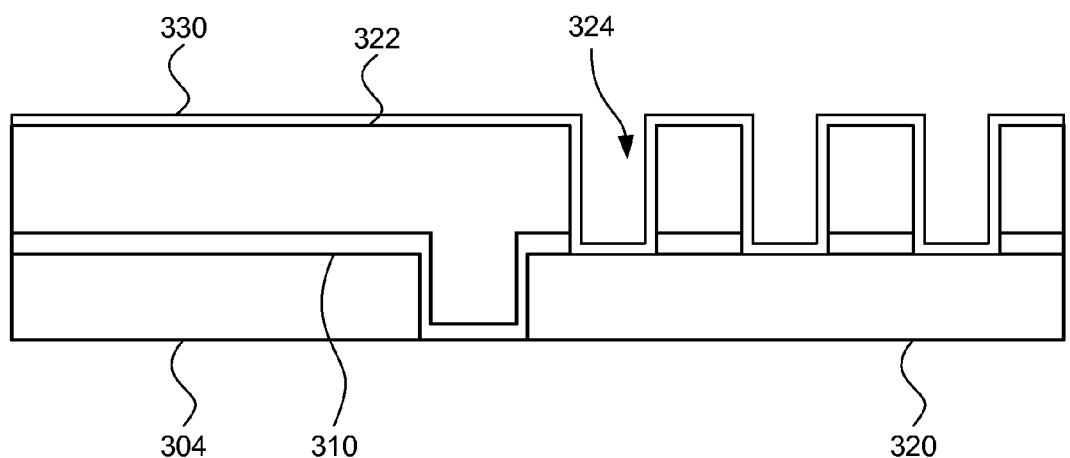
FIG. 3B depicts an embodiment of the semiconductor device of FIG. 3A after depositing an adhesive layer.

FIG. 3B depicts an embodiment of the semiconductor device 300 of FIG. 3A after depositing an adhesive layer 330. Some embodiment do not utilize the adhesive layer 330, but the adhesive layer 330 may serve many purposes including improving adhesion to the underlying layer, avoiding etching of the underlying oxide during CVD tungsten deposition, reducing stress on the electrically conductive material, and creating a good Ohmic electrical contact to any underlying material. In some embodiments, the adhesive layer 330 includes titanium, titanium nitride, or a combination thereof.

Figure 3C:
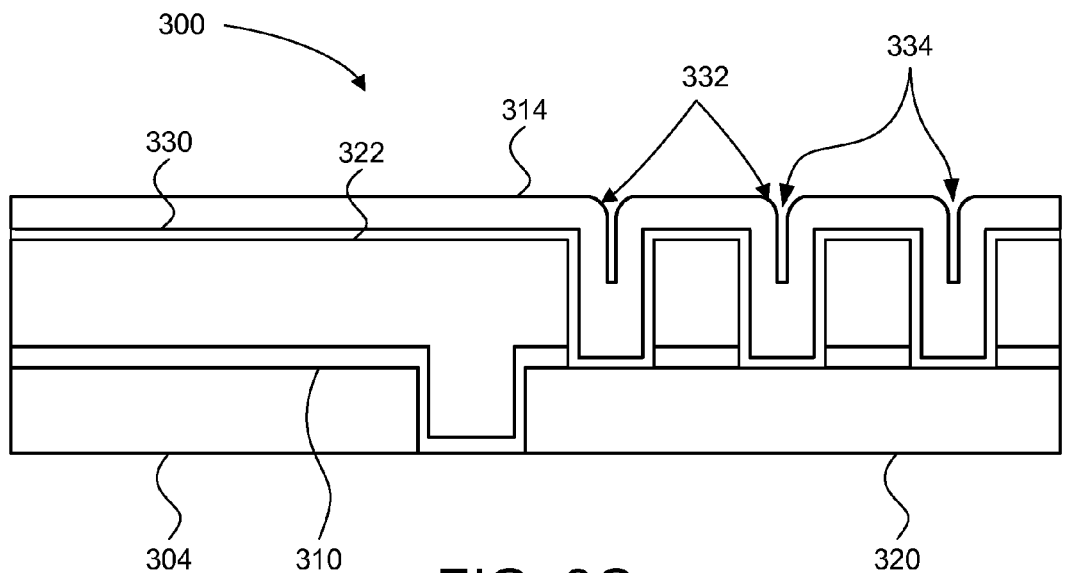
FIG. 3C depicts an embodiment of the semiconductor device of FIG. 3B after conformally depositing a first electrically conductive material above the sacrificial layer and into a sidewall boundary trench.

FIG. 3C depicts an embodiment of the semiconductor device 300 of FIG. 3B after conformally depositing a first electrically conductive material 314 above the sacrificial layer 322 and into the sidewall boundary trenches 324. The conformal deposition of the first electrically conductive material 314 deposits a first layer of material above the sacrificial layer 322 and in the boundary trenches 324. The transition of the material 314 from the top of the sacrificial layer 322 to the boundary trench 324 creates a transition portion 332 located above the boundary trench 324. Even a conformally deposited layer will leave a slot or seam 334 in the material 314. The effect will be even more pronounced and severe with a physical vapor deposition (PVD) deposited layer.

As discussed earlier, utilizing tungsten as a membrane material allows for many advantages including thermally and structurally and allows for the fabrication of a capacitive pressure sensor above an integrated circuit using standard CMOS fabrication techniques.

One might argue that it is beneficial to fill the boundary trenches 324 with tungsten and deposit the membrane in one step. However, this approach has disadvantages of stress tuning and also and more importantly from membrane integrity point of view. A one step integration approach (depositing the boundary anchor points and the membrane in one step) is not a feasible manufacturing approach. This problem was encountered when using tungsten filled boundary trenches 324 as supporting structure for a suspended tungsten membrane.

Stress failure of the membrane upon release of the membrane occurs during the one step integration approach. The corner transition portion 332 is a point of high localized stress of the membrane. The corner transition portion 332 is point of uneven topography and may form a corner, may have a rounded corner, or may transition less than or more than 90° from horizontal. As can be seen from FIG. 3C, once the sacrificial layer 322 is removed, the membrane will flex under pressure and the corner transition portion 332 becomes a localized point of high stress resulting in cracking and stress failure at the corner transition portion 334. The localized stress can easily amount to 15000 MPa, leading to cracks and fatal fracture during release or subsequent processing. To eliminate the high stress and fatal fracture of the membrane, further steps and processes result in reducing the localized stress points.

A finite element analysis showed that the stress at the corner transition portions and the seams or slots increased by a factor of ten compared to other parts of the membrane. Such a high internal stress causes the membrane to crack at these locations because the stress exceeds the local yield strength. By eliminating these localized points of high stress, failure of the membrane during release and subsequent processing can be eliminated.

The subsequent processing steps are described further in FIGS. 3D through 3I, and include a chemical mechanical polishing (CMP) step to remove at least a portion of the first electrically conductive material 314. The chemical mechanical polishing step allows for removal of uneven topography, such as the slot or seam 334 and the corner transition portion 332. By removing the material by CMP, only the topography will be removed as the material in the boundary trenches 324 will be protected by the sacrificial layer 322 and the material portions 326. After removing a portion of the first electrically conductive material 314, a second electrically conductive material may be re-deposited above the sacrificial layer 322 and the first electrically conductive material 314 located within the boundary trenches 324. The subsequent depositing of the second layer of material allows for the material to be deposited with substantially flat topography without the slots, seams, and corner transition portions. The subsequent deposition also allows for the second electrically conductive material 302 to be deposited beyond multiple boundary trenches which allows for stress distribution over more than just the first boundary trench.

The first electrically conductive material 314 located in the boundary trenches 324 may serve many purposes including anchors to the suspended membrane, electrical connection paths for the top electrode, and as etch stops around the sacrificial layer 322 and subsequent cavity.

Figure 3D:
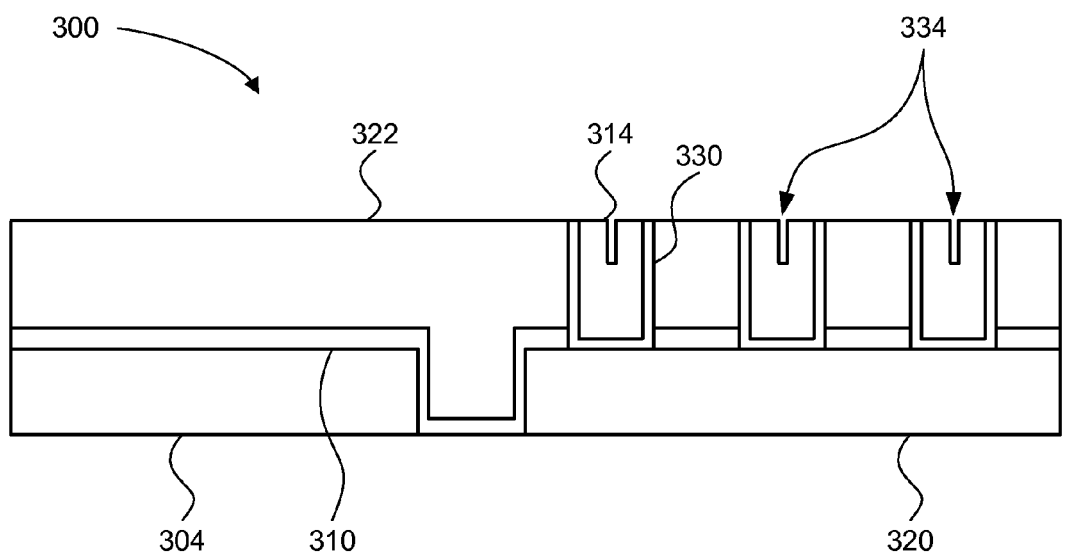
FIG. 3D depicts an embodiment of the semiconductor device of FIG. 3C after removing a portion of the first electrically conductive material.

FIG. 3D depicts an embodiment of the semiconductor device 300 of FIG. 3C after removing a portion of the first electrically conductive material 314. As shown, a portion of the first electrically conductive material 314 is removed from above the sacrificial layer 322 (a portion of the adhesive layer 330 is also removed). In addition, the corner transition portion 332 is also removed above the boundary trenches 324. A portion of the slot or seam 334 may still be present but the majority of the topography is now flat and ready for redepositing a second electrically conductive material with a substantially flat topography and without any corner portions 332 that may lead to failure. The first electrically conductive material 314 serves as supporting anchors for the second electrically conductive material that will be deposited as the membrane. In some embodiments, the supporting anchors may still include a portion of the seams or slots 334.

In some embodiments, the removing a portion of the first electrically conductive material 314 is accomplished by chemical mechanical polishing (CMP) which may allow for the removal of all electrically conductive material outside of the boundary trenches 324. In some embodiments, the removal removes all the material down to the level of the sacrificial layer 322. In some embodiments, only a portion of the material above the sacrificial layer 322 is removed. In some embodiments, only a portion of the corner transition portion 332 is removed. In some embodiments, all seams 334 and corner transition portions 332 are completely removed during a chemical mechanical polishing (CMP) step.

Although not depicted in FIG. 3D, uneven topography and corner transition portions may occur at other points in addition to above the boundary trenches 324. For example, the bottom electrode 304 may be patterned (as shown in FIGS. 1-2), resulting in uneven topography of the first electrically conductive material 314 above the sacrificial layer 322. Such uneven topography above the sacrificial layer 322 may be removed as well in the removal step. Without removing such uneven topography and corner transitions, localized stress may be too great, resulting in damaging the membrane upon suspension.

Figure 3E:
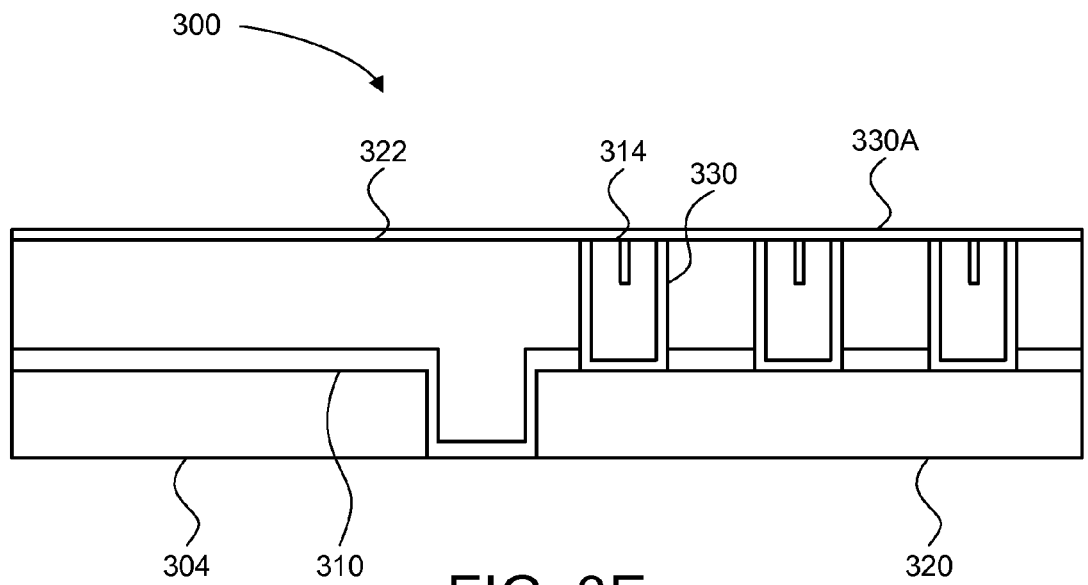
FIG. 3E depicts an embodiment of the semiconductor device of FIG. 3D after depositing an adhesive layer.

FIG. 3E depicts an embodiment of the semiconductor device of FIG. 3D after depositing an adhesive layer 330A. The adhesive layer 330A may be deposited before depositing the second electrically conductive material. The adhesive layer 330A may be the same material as the previous adhesive layer 330 and may serve many of the same functions as the previous adhesive layer 330. Some embodiments do not include the adhesive layer 330A. By removing a portion of the first electrically conductive material 314 and subsequently depositing a second electrically conductive material or second layer of material, the deposition of the adhesive layer 330 in the boundary trenches 324 can be decoupled from the subsequent deposition of the adhesive layer 330A as part of the membrane stack. This allows application of a thick adhesive layer as stress compensation for the suspended membrane.

Figure 3F:
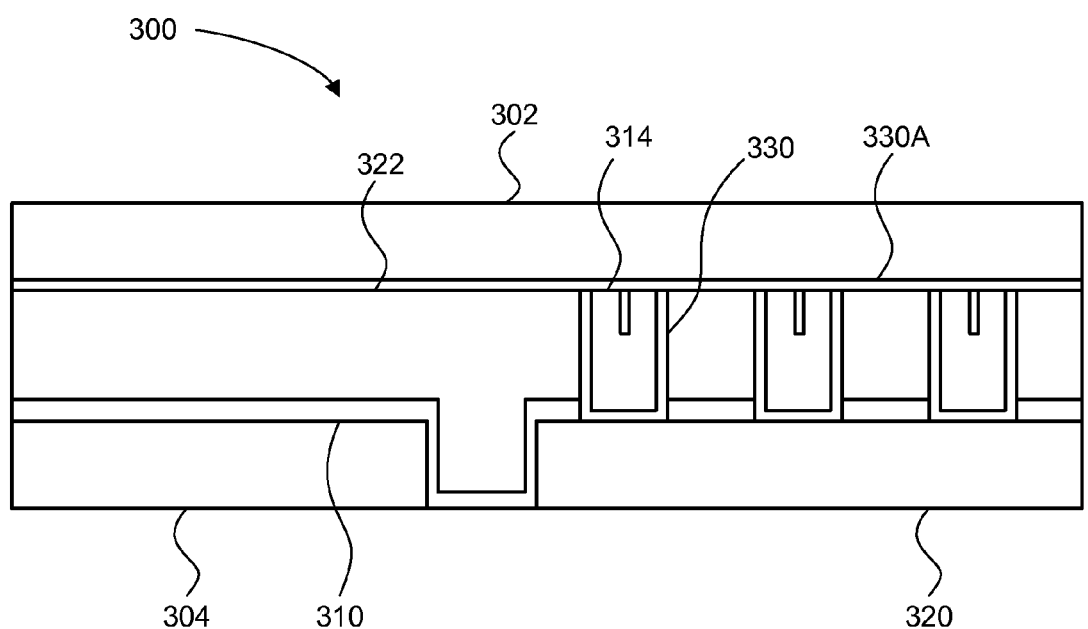
FIG. 3F depicts an embodiment of the semiconductor device of FIG. 3E after conformally depositing a second electrically conductive material above the sacrificial layer and extending beyond the first electrically conductive material and the boundary trench.

FIG. 3F depicts an embodiment of the semiconductor device 300 of FIG. 3E after conformally depositing a second electrically conductive material 302 above the sacrificial layer 322 and extending beyond the first electrically conductive material 314 and the boundary trench 324. The second electrically conductive material 302 may be the same material as the first electrically conductive material 314 or may be a different material. The first layer of material 314 serves as support and anchor points for the second layer of material 302. This reduces the problematic stress that occurs when only a single layer of material is deposited as the transition from above the sacrificial layer 322 to the boundary trenches 324 will result in high localized stress points.

Figure 3G:
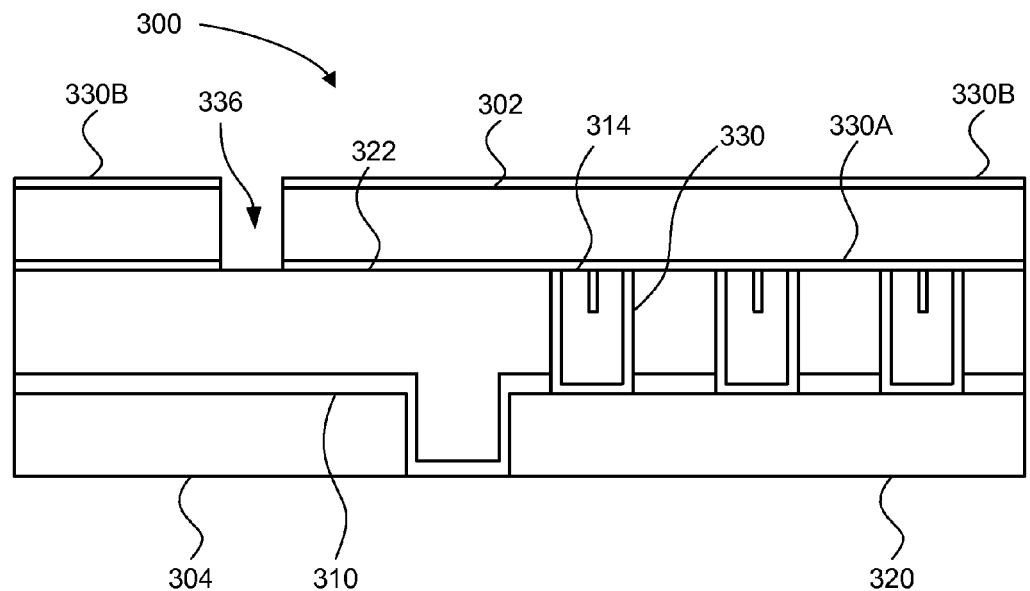
FIG. 3G depicts an embodiment of the semiconductor device of FIG. 3F after depositing an adhesive layer above the second electrically conductive material and creating etch openings above the sacrificial layer.

FIG. 3G depicts an embodiment of the semiconductor device 300 of FIG. 3F after depositing another adhesive layer 330B above the second electrically conductive material 302 and creating etch openings 336 above the sacrificial layer 322. The adhesive layer 330B may be the same material as the previous adhesive layers 330 and 330A and may serve many of the same functions as the previous adhesive layers 330 and 330A. Some embodiments do not include the adhesive layer 330B. The thickness of the adhesive layer 330B and other adhesive layers may be optimized to reduce the stress of the membrane 302.

Figure 3H:
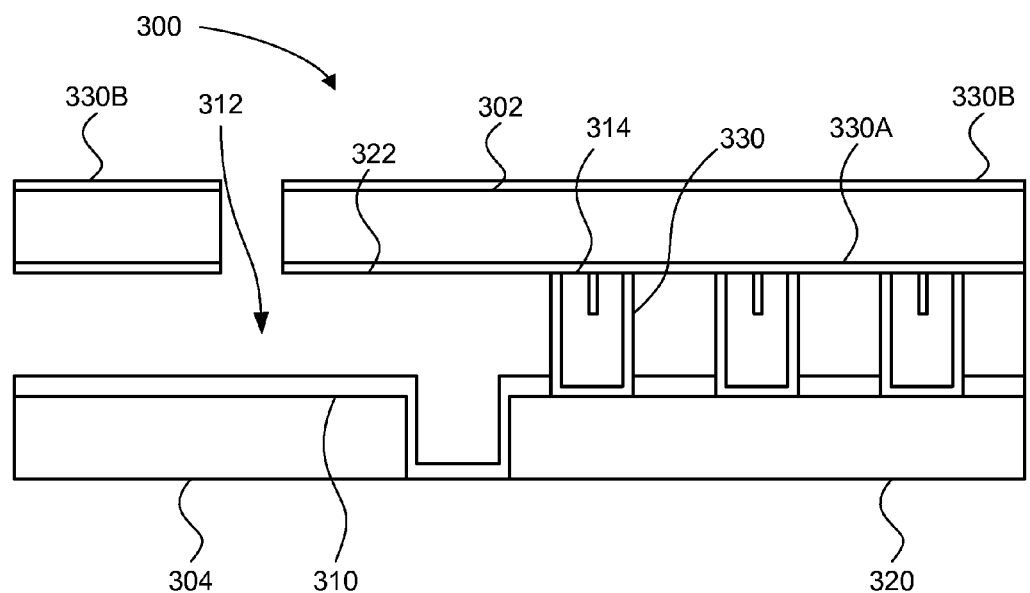
FIG. 3H depicts an embodiment of the semiconductor device of FIG. 3G after removing the sacrificial layer and releasing the membrane of the semiconductor device.

FIG. 3H depicts an embodiment of the semiconductor device 300 of FIG. 3G after removing the sacrificial layer 322 and releasing the membrane 302 of the semiconductor device 300. The sacrificial layer 322 may be oxide and may be removed by an HF vapor that will remove the sacrificial oxide layer 322 without attacking first electrically conductive material 314. As tungsten is inert to HF vapor, the first electrically conductive material 314 serves as an etch stop and allows for the accurate creation of a cavity 312. By etching the sacrificial layer 322 to the first electrically conductive material 314, the size and shape of the cavity 312 can be controlled without having to monitor a lateral etching rate. In addition, when it is necessary to control the lateral etching rate, the size of the etch openings 336 may need to be larger and there may need to be more etch openings 336 on membrane 302. Reducing the number and size of the etch openings may allow for more structurally sound suspended membranes and can reduce costs and issues during sealing of the cavity 312.

Figure 3I:
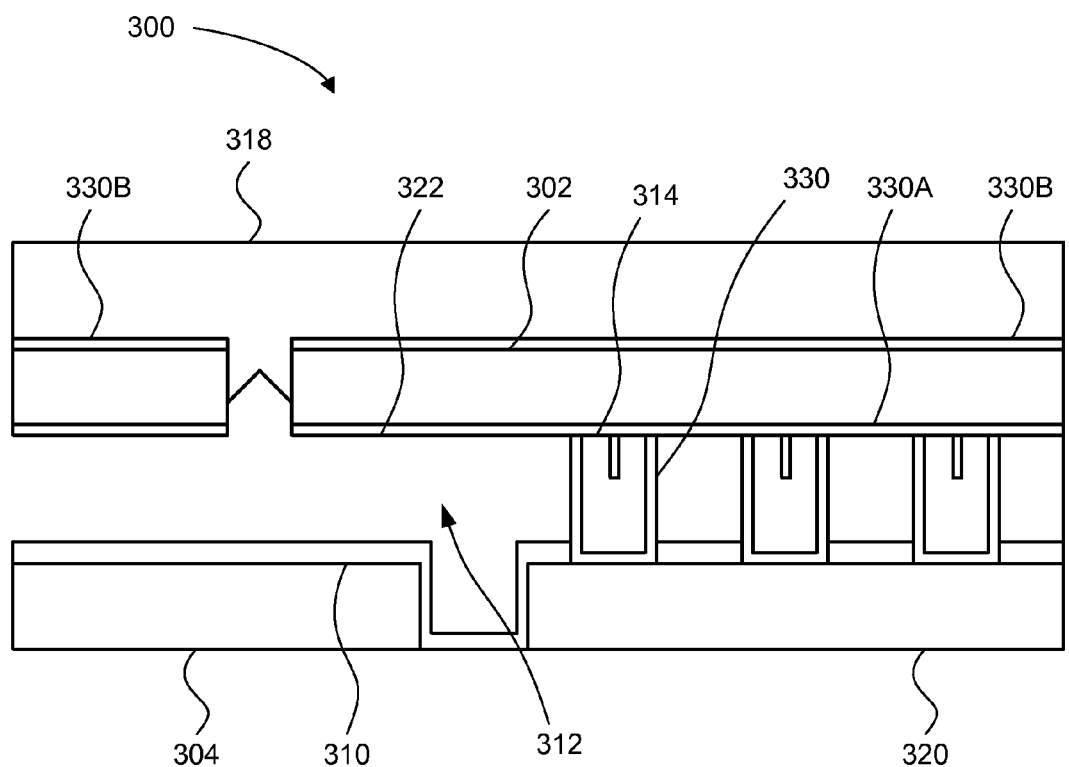
FIG. 3I depicts an embodiment of the semiconductor device of FIG. 3H after depositing a sealing layer above the second electrically conductive material and sealing etch openings above the cavity.

FIG. 3I depicts an embodiment of the semiconductor device 300 of FIG. 3H after deposition of a sealing layer 318 above the second electrically conductive material 302 and sealing etch openings 336 above the cavity 312. The etch openings 336 and the cavity 312 may be sealed by a silicon nitride or silicon oxide dielectric film. The sealing layer 318 may be a dielectric sealing layer used to fill partially or completely the etch openings 336. In some embodiments, sealing layer 318 may be a metallic sealing layer used to fill partially or completely the etch openings 336. In some embodiments, the membrane 302 may be completely sealed and then subsequently opened again at selected spots to create venting holes. The sealing layer 318 may include silicon dioxide, silicon nitride, or a stacked combination of these materials. Deposition methods may include high density plasma oxide (HDP oxide), Plasma Enhanced Chemical Vapor Deposition (PECVD), Physical Vapor Deposition (PVD), Chemical Vapor Deposition (CVD), and Atomic Layer Deposition (ALD). In some embodiments, the second electrically conductive material 314 has a tensile stress larger than six hundred (600) MPa. In one example, Tungsten has a typical tensile stress of 1500-1600 MPa. Ti/TiN films (or adhesive layers) have a tensile stress of 450-500 MPa each. The overall stress of the second electrode layer is 1000-1100 MPa. It can be evaluated that membrane buckling will occur if the overall stress of the second electrode material is lower than 600 MPa given the electrode stack composition of 150 nm Ti/TiN, 440 nm W, and 170 nm TiN/Ti/TiN. It implies that if a pure Ti/TiN membrane would have been employed the sealing step cannot be performed at elevated temperatures (i.e. 350 C).

Embodiments described herein avoid uncontrolled lateral etching and accurately control cavity diameter and cavity size and shape. Embodiments described herein avoid fatal fracture and delaminating of the membrane.

While many of the examples and embodiments described herein referred generally to a circular cavity and membrane, it is noted that many different shapes and sizes are contemplated. In some embodiments square and rectangular membrane shapes are employed. In contrast to circular membranes the stress is not constant around the perimeter: e.g. for square membranes the highest lateral stress is encountered at the edge halfway the edge length. Therefore, it is imperative to avoid topography at the membrane edge and sharp corners for the supporting anchors. Measures taken to reduce stress at the trench corners are especially beneficial for these structures. In addition, an array of capacitive pressure membranes may be fabricated above an integrated circuit. The array of capacitive pressure membranes may each have a unique size and shape to function and optimize the sensitivity to environments of varying temperatures and pressures.

In an example embodiment, a membrane may have a 240 μm diameter. The top electrode may have a material thickness of 750 nm (150 nm Ti/TiN, 450 nm W, 150 nm Ti/TiN). The Ti/TiN may have a tensile stress of 500 MPa, while the W may have a tensile stress of 1600 MPa. A SiN sealing layer may have a thickness of 2000 nm with a compressive stress of 200 MPa. A gap height may be 650 nm and a Si-rich SiN isolation layer may be 200 nm. Each dimension in this example embodiment may vary by a reasonable percentage.

The various depositions of electrically conductive materials, electrodes, and adhesive layers described herein may be accomplished by differing methods including chemical vapor deposition.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for forming a suspended membrane, the method comprising:
   depositing a first electrically conductive material above a sacrificial layer and within a boundary trench, wherein the first electrically conductive material forms a corner transition portion above the boundary trench;
   removing a portion of the first electrically conductive material, wherein the removing removes at least a portion of uneven topography of the first electrically conductive material;
   depositing a second electrically conductive material, the second electrically conductive material extending beyond the boundary trench;
   removing the sacrificial layer through etch openings and forming a cavity below the second electrically conductive material, wherein the first electrically conductive material defines a portion of a sidewall boundary of the cavity.

2. The method of claim 1, wherein the suspended membrane is formed as part of a capacitive pressure sensor.

3. The method of claim 1, wherein the suspended membrane is formed on top of an integrated circuit.

4. The method of claim 1, wherein the method further comprises:
   forming a bottom electrode before forming the suspended membrane, wherein the bottom electrode is below the suspended membrane, wherein the suspended membrane forms a second electrode; and forming an isolation layer above the bottom electrode, wherein the isolation layer comprises silicon nitride.

5. The method of claim 1, wherein the removing the portion of the first electrically conductive material removes the corner transition portion above the boundary trench.

6. The method of claim 1, wherein the removing the portion of the first electrically conductive material removes uneven topography above the sacrificial layer and above the boundary trench.

7. The method of claim 1, wherein the method further comprises depositing an adhesive layer prior to the depositing the second electrically conductive material, wherein the adhesive layer comprises one of titanium or titanium nitride.

8. The method of claim 1, wherein the method further comprises depositing an adhesive layer on top of the second electrically conductive material, wherein the adhesive layer comprises one of titanium or titanium nitride.

9. The method of claim 1, the method further comprising forming a bottom electrode below the suspended membrane, wherein the bottom electrode is formed on top of a passivation layer of an integrated circuit.

10. The method of claim 1, wherein the second electrically conductive material comprises tungsten wherein the second electrically conductive material is deposited by chemical vapor deposition.

11. The method of claim 1, wherein the second electrically conductive material has a tensile stress larger than 600 MPa.

12. The method of claim 1, wherein the suspended membrane is formed as part of a capacitive pressure sensor, wherein the capacitive pressure sensor is formed on top of an integrated circuit, and wherein the method further comprises:
    forming a bottom electrode below the suspended membrane;
    forming an isolation layer above the bottom electrode, wherein the etch stop layer comprises silicon nitride;
    depositing a first adhesive layer prior to the depositing the second electrically conductive material, wherein the first adhesive layer comprises one of titanium or titanium nitride, and wherein the second electrically conductive material comprises tungsten;
    depositing a second adhesive layer above the second electrically conductive material, wherein the second adhesive layer comprises one of titanium or titanium nitride; and
    forming a sealing layer to seal the etch openings, wherein the sealing layer comprises silicon nitride or silicon oxide.

13. The method of claim 1, wherein the boundary trench defines the side boundary of the sacrificial layer, and wherein the first electrically conductive material deposited within the boundary trench defines the sidewall boundary of the cavity.

14. The method of claim 1, wherein the second electrically conductive material is a substantially continuous layer over the sacrificial layer and extending beyond the first electrically conductive material within the boundary trench.

15. A semiconductor device comprising:
    a top electrode suspended above a bottom electrode, a cavity separating the bottom and top electrode, wherein the top electrode comprises:
        a first electrically conductive material, the first electrically conductive material forming a portion of a sidewall boundary of the cavity; and
        a second electrically conductive material above the cavity, wherein the second electrically conductive material extends beyond the first electrically conductive material, wherein a portion of the first electrically conductive material serves as supporting anchors for the second electrically conductive material, wherein the second electrically conductive material comprises a substantially flat topography over the cavity and the supporting anchors,
    wherein the top electrode forms part of a capacitive pressure sensor, wherein the second electrically conductive material comprises tungsten, and
    wherein the capacitive pressure sensor further comprises:
        an isolation layer covering the bottom electrode, wherein the isolation layer comprises a silicon compound or a stacked combination of silicon compounds;
        a first adhesive layer below the second electrically conductive material, wherein the first adhesive layer comprises at least one of titanium, a titanium compound, or a stacked combination of titanium compounds;
        a second adhesive layer above the second electrically conductive material, wherein the second adhesive layer comprises at least one of titanium, a titanium compound, or a stacked combination of titanium compounds; and
        a sealing layer covering the second electrically conductive material, wherein the sealing layer comprises a silicon compound or a stacked combination of silicon compounds.

16. The semiconductor device of claim 15, wherein the top electrode forms part of a capacitive pressure sensor.

17. The semiconductor device of claim 15, wherein the top electrode forms part of a capacitive pressure sensor, and wherein the semiconductor device further comprises an integrated circuit, wherein the capacitive pressure sensor is formed on top of the integrated circuit.

18. The semiconductor device of claim 15, wherein the second electrically conductive material comprises tungsten.

19. The semiconductor device of claim 15, wherein the first electrically conductive material forms the entire sidewall boundary of the cavity.

20. A semiconductor device comprising:
    a top electrode suspended above a bottom electrode, a cavity separating the bottom and top electrode, wherein the top electrode comprises:
        a first electrically conductive material, the first electrically conductive material forming a portion of a sidewall boundary of the cavity; and
        a second electrically conductive material above the cavity, wherein the second electrically conductive material extends beyond the first electrically conductive material, wherein a portion of the first electrically conductive material serves as supporting anchors for the second electrically conductive material, wherein the second electrically conductive material comprises a substantially flat topography over the cavity and the supporting anchors,
    wherein the top electrode forms part of a capacitive pressure sensor, wherein the second electrically conductive material comprises tungsten, and
    wherein the capacitive pressure sensor further comprises:
        an isolation layer covering the bottom electrode, wherein the isolation layer comprises silicon nitride;
        a first adhesive layer below the second electrically conductive material, wherein the first adhesive layer comprises titanium or titanium nitride;
        a second adhesive layer above the second electrically conductive material, wherein the second adhesive layer comprises titanium or titanium nitride; and a sealing layer covering the second electrically conductive material, wherein the sealing layer comprises silicon nitride or silicon oxide.

* * * * *